(12) United States Patent
Akahori

(10) Patent No.: US 10,963,212 B2
(45) Date of Patent: Mar. 30, 2021

(54) SEMICONDUCTOR DEVICE AND SOUND OUTPUT DEVICE

(71) Applicant: LAPIS Semiconductor Co., Ltd., Yokohama (JP)

(72) Inventor: Hiroji Akahori, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 16/568,889

(22) Filed: Sep. 12, 2019

(65) Prior Publication Data

US 2020/0081684 A1  Mar. 12, 2020

(30) Foreign Application Priority Data

Sep. 12, 2018  (JP) .............................. JP2018-170850

(51) Int. Cl.
| | | |
|---|---|---|
| *H03G 5/00* | (2006.01) | |
| *G06F 3/16* | (2006.01) | |
| *H03F 3/21* | (2006.01) | |
| *H04R 3/04* | (2006.01) | |
| *H03M 1/10* | (2006.01) | |

(52) U.S. Cl.
CPC .............. *G06F 3/165* (2013.01); *H03F 3/21* (2013.01); *H03M 1/1071* (2013.01); *H04R 3/04* (2013.01); *H03F 2200/03* (2013.01)

(58) Field of Classification Search
CPC .... H03F 3/21; H03F 2200/03; H03M 1/1071; H04R 3/04; G06F 3/165

USPC ...................................................... 381/98, 99
See application file for complete search history.

(56) References Cited

U.S. PATENT DOCUMENTS 4,752,832 A * 6/1988 Higurashi .............. H04N 9/802
 386/309
2018/0358937 A1* 12/2018 Nakata ...................... H03F 3/45

FOREIGN PATENT DOCUMENTS

| JP | H01-176952 A | 7/1989 |
|---|---|---|
| JP | 2005-202624 A | 7/2005 |
| JP | 2014-230016 A | 12/2014 |

* cited by examiner

*Primary Examiner* — Ammar T Hamid
(74) *Attorney, Agent, or Firm* — Rabin & Berdo, P.C.

(57) ABSTRACT

A sound source playback unit plays back sound data from a sound source and outputs a playback signal. An amplification unit amplifies the playback signal and outputs the playback signal as an output signal converted to sound in a speaker. A fault detection unit including a first conversion circuit compares the playback signal to a predetermined first threshold, converts a waveform of the playback signal, and outputs the converted waveform as a converted playback signal. A second conversion circuit compares the output signal to a predetermined second threshold, converts a waveform of the output signal, and outputs the converted waveform as a converted output signal. A comparison circuit compares the converted playback signal to the converted output signal, and a determination circuit determines an output of the comparison circuit. Based on the determination, the fault detection unit detects a fault in the amplification unit.

9 Claims, 12 Drawing Sheets

SEMICONDUCTOR DEVICE AND SOUND OUTPUT DEVICE

TECHNICAL FIELD

The present invention relates to a semiconductor device and a sound output device, and in particular relates to a technique that can be effectively applied to a semiconductor device and a sound output device having a fault detection function.

BACKGROUND ART

Regarding fault detection, Japanese Patent Application Laid-Open Publication No. 2014-230016 discloses a fault detection device that detects an anomaly in an amplifier of an alarm device that includes an alarm sound emission means that emits an alarm sound, an alarm signal transmission means that transmits, to the alarm sound emission means, an alarm signal for emitting an alarm sound, and an amplifier that amplifies the alarm signal, the fault detection device having: a detection signal transmission means that transmits, to the amplifier, a fault detection signal having two pulse waves of differing polarities and phases; a first detection circuit for detecting a first detection signal attained by the amplifier amplifying the fault detection signal and outputting the amplified fault detection signal from a positive-side output terminal; a second detection circuit for detecting a second detection signal attained by the amplifier amplifying the fault detection signal and outputting the amplified fault detection signal from a negative-side output terminal; and a determination means that determines whether or not an anomaly has occurred in the amplifier on the basis of the detected first detection signal and second detection signal.

Also, Japanese Patent Application Laid-Open Publication No. 2005-202624 discloses an electronic device having: a sensor; a microcomputer that selects sound source data by controlling a sound source IC when it is determined according to a detection signal from the sensor that an anomaly has occurred; an amplification means that amplifies the sound source data outputted from the sound source IC; an alarm output means that is connected to the amplification means and that outputs an alarm sound based on the sound source data; and a fault test means that outputs a test signal to the alarm output means, the microcomputer including a fault diagnosis means that controls the fault test means so as to output the test signal, and determines that the alarm output means is in a normal state if the test signal is detected to be flowing to the alarm output means.

Meanwhile, Japanese Patent Application Laid-Open Publication No. H1-176952 discloses a fault diagnosis device for an audio device having: a voltage source that is connected to a prescribed circuit of an audio device when diagnosing a fault, and that supplies a prescribed voltage to the circuit; a means that is connected between the prescribed circuit of the audio device and the voltage source and forms a voltage-dividing circuit together with the circuit; a means for detecting the voltage of the means forming the voltage-dividing circuit and comparing the voltage to a reference value; and a means for performing notification according to comparison results from the means that performs comparison.

SUMMARY OF THE INVENTION

Currently, speech notification regarding handling and the like has become common in devices in various technical fields. For example, in the field of automobiles, speech notification is used for driving assistance, notification of faults, and the like.

Meanwhile, the concept of functional safety is currently under consideration. Functional safety is a general term for techniques used to avoid unacceptable risks using safety functions and measures. The "function" in functional safety refers to the role of safety devices that monitor an object to be controlled or a controller. Typically, safety devices use computers, and if a fault or the like occurs in the controller, the computer stops operation of the object to be controlled and issues a warning to the user. The issuance of the warning is often performed by speech.

In other words, sound output devices in various modern devices often have the function not only of emitting speech or music, but also the function of issuing a notification of information directly relevant to safety. Thus, it is important to ensure that such sound output devices are reliable. As one aspect of ensuring the reliability of sound output devices, there is increased importance for detecting faults such as a signal not reaching a speaker, for example. In such a case, more detailed detection of faults is desirable from the perspective of reliability, with no great increase in cost. Furthermore, current sound output devices include not only those that handle analog signals but many sound output devices handle digital signals, and thus, techniques applicable to both types of sound output devices are sought after.

The present invention considers the above situation, and an object thereof is to provide a semiconductor device and a sound output device that can perform detailed detection of faults in a relatively small-scale circuit, and can handle various signal formats.

In order to solve the above problem, a semiconductor device according to one aspect of the present invention includes: a sound source playback unit that plays back a sound source and outputs a playback signal; an amplification unit that amplifies the playback signal and outputs the playback signal as an output signal converted to sound in a speaker; and a fault detection unit including a first conversion circuit that compares the playback signal to a predetermined first threshold, converts a waveform of the playback signal, and outputs the converted waveform as a converted playback signal, a second conversion circuit that compares the output signal to a predetermined second threshold, converts a waveform of the output signal, and outputs the converted waveform as a converted output signal, a comparison circuit that compares the converted playback signal to the converted output signal, and a determination circuit that determines an output of the comparison circuit, the fault detection unit detecting a fault in the amplification unit.

A sound output device according to another aspect of the present invention includes: the above-mentioned semiconductor device; a sound source that transmits a signal to be played back by the sound source playback unit; and a speaker that amplifies the playback signal and converts the playback signal to sound.

The present invention exhibits the effect of enabling provision of a semiconductor device and a sound output device that can perform detailed detection of faults in a relatively small-scale circuit, and can handle various signal formats.

DETAILED DESCRIPTION OF EMBODIMENTS

Below, embodiments of the present invention will be described in detail with reference to the drawings. In the description that follows, embodiments of the invention are described in the context of being installed in a moving body such as an automobile, such that the sound output device is a speaker in the automobile. In the example embodiments, a sound output device that outputs assistance speech for driving or the like, and a configuration of a semiconductor device according to the present invention that is applied to a sound playback device is also illustrated. Furthermore, a configuration in which the sound output device (semiconductor device) according to embodiments below is connected to a microcontroller unit (MCU) that is not shown and receives controls from the MCU is described as an example. However, embodiments of the invention include sound output devices in any other context, not just in a moving vehicle.

Embodiment 1

Figure 1:
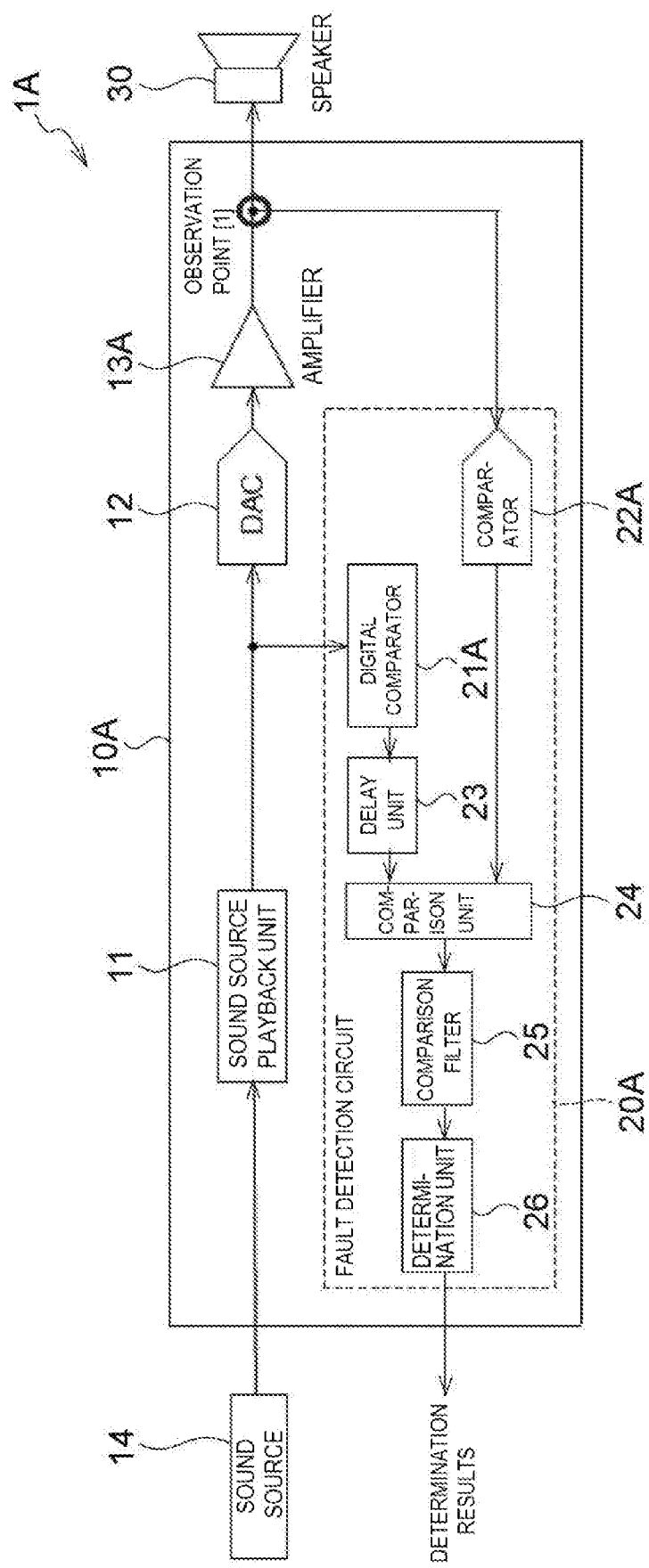
FIG. 1 is a block diagram showing an example of a semiconductor device and a sound output device according to one embodiment.

A semiconductor device and a sound output device according to the present embodiment will be described with reference to FIG. 1. As shown in FIG. 1, the sound output device 1A according to the present embodiment includes a semiconductor device 10A, a sound source 14, and a speaker 30.

The sound source 14 is a device, or portion of a device, that stores a signal to be played back by the semiconductor device 10A. In one example of the sound source 14, the above-mentioned assistance speech is stored in a signal format such as pulse-code modulation (PCM). A sound source stored on a storage medium such as a CD or a sound source stored in a storage unit such as the MCU is used as the sound source 14, for example, and this sound source is inputted to a sound source playback unit 11 through an interface (not shown) in the semiconductor device 10A. The present embodiment describes, as an example, a configuration in which the sound source 14 is connected as an external unit to the semiconductor device 10A, but a sound source that is stored in a memory or the like provided inside the semiconductor device 10A and read as necessary may be used as the sound source 14. Embodiments of the invention include a sound source 14 that may be internal to or external to the semiconductor device 10A. The sound source 14 may be any type of memory device used to store sound information that may be processed by the semiconductor device 10A and output by the speaker 30.

The semiconductor device 10A includes the sound source playback unit 11, a digital-to-analog converter 12 (DAC), an analog amplifier 13A, and a fault detection circuit 20A. The sound source playback unit 11 is a circuit that generates an input signal to the DAC or a digital amplifier to be mentioned later, and, in one example, outputs a signal that is speech data including the sampling timing. The sound source playback unit 11 also includes a circuit, such as a decoder such as MP3 or adaptive differential pulse-code modulation (ADPCM), that converts a compressed sound source to an input signal for a DAC or a digital amplifier, for example. In other words, the sound source playback unit 11 is a circuit that plays back (decodes) a PCM signal received from the sound source 14 and outputted by the speaker 30, and converts the PCM signal into a sampled digital signal (hereinafter, "playback signal"). The analog amplifier 13A is a circuit that amplifies an analog signal from the DAC 12.

The fault detection circuit 20A includes a digital comparator 21A, a comparator 22A, a delay unit 23, a comparison unit 24, a comparison filter 25, and a determination unit 26.

The digital comparator 21A is a circuit that has a preset threshold and that compares the inputted playback signal to the threshold and converts the playback signal to a binary signal including a signal greater than the threshold and a signal less than the threshold. The comparator 22A is a circuit that also has a preset threshold and that compares an inputted analog signal (hereinafter, "output signal") from the analog amplifier 13A to the threshold and converts the playback signal to a binary signal including a signal greater than the threshold and a signal less than the threshold. The reason for using a digital comparator 21A and a comparator 22A in the semiconductor device 10A of the present embodiment is in order to convert the playback signal and the output signal into a comparable signal format (amplitude, etc.) for when the comparison unit 24 to be mentioned later performs a logical comparison of the playback signal and the output signal. The digital comparator 21A is an example of the first conversion circuit of the present invention, and the comparator 22A is an example of the second conversion circuit of the present invention. Below, "conversion circuit" is sometimes used as a general term for the first conversion circuit and the second conversion circuit.

The delay unit 23 is a circuit for suppressing the difference between a delay time in the path from the sound source playback unit 11 to the digital comparator 21A and the delay time in the path of the sound source playback unit 11, the DAC 12, the analog amplifier 13A, and the comparator 22A. In other words, the delay time on the latter path is greater than the delay time in the former path by primarily an amount equal to the time required for the signal to pass through the DAC 12 and the analog amplifier 13A. Thus, the delay unit 23 is provided in order to match the times at which signals passing through both paths are inputted to the comparison unit 24. The bit width is reduced by the digital comparator 21A, which provides the advantage that the circuit size is reduced in relation to the number of delay stages. Of course, the delay unit 23 may be omitted if the difference in delay times poses no problem.

The comparison unit 24 is a circuit that logically (i.e. using digital logic circuitry) compares a playback signal from the delay unit 23 to an output signal from the comparator 22A. The comparison unit 24 is configured using an exclusive disjunction (XOR) circuit, for example, and outputs a logical value of "0" if the playback signal matches the output signal and outputs a logical value of "1" if the playback signal differs from the output signal, for example.

The comparison filter 25 is a low-pass filter (LPF) that smooths comparison results from the comparison unit 24. An output Fo from the comparison filter 25 satisfies 0<Fo<1 according to the statistical degree of matching between the playback signal and the output signal. If the output of the comparison unit 24 follows the above logic, then it is determined that the closer the value of Fo is to 0, the greater the degree of matching is between the playback signal (played back sound source signal) and the output signal (input signal of speaker), and thus, that a fault has not occurred.

The determination unit 26 determines whether or not the playback signal matches the output signal on the basis of the output from the comparison filter 25. As described above, the output Fo from the comparison filter 25 is an analog value within the range of 0<Fo<1, and thus, a threshold Vtf is set for the determination unit 26 and it is determined whether there is a match according to the size relationship between the output Fo and the threshold Vtf. That is, if 0<Fo<Vtf, then the playback signal matches the output signal, and if Vtf<Fo<1, then the playback signal differs from the output signal and it is determined that a fault has occurred. The determination results from the determination unit 26 are transmitted to an MCU (not shown), for example, and the MCU upon receiving the determination results performs the necessary notification or the like through a UI (user interface) or the like (not shown), for example.

As described above, the semiconductor device 10A of the present embodiment includes a fault detection circuit 20A. The fault detection circuit 20A compares the digital signal immediately after the sound source 14 is played by the sound source playback unit 11 to the analog signal immediately before being inputted to the speaker 30, and detects a fault between extracted points of the two signals, or in other words, a fault primarily in the section including the DAC 12 and the analog amplifier 13A in the present embodiment.

Also, in the semiconductor device 10A and the sound output device 1A of the present embodiment, in consideration of the fact that the playback signal (digital signal in the present embodiment) outputted from the sound source playback unit 11 cannot be directly compared to the output signal (analog signal in the present embodiment) inputted to the speaker 30 due to differences in signal format, signal level, and the like, conversion circuits (digital comparator 21A, comparator 22A) are introduced to convert both signals so as to be comparable to each other. This is conceptually similar to that of the semiconductor devices and sound output devices of other embodiments described below.

As described above, according to the semiconductor device 10A and the sound output device 1A of the present embodiment, it is possible to provide a semiconductor device and a sound output device that can perform detailed detection of faults using a relatively small scale circuit. Also, according to the semiconductor device 10A and the sound output device 1A, in order to compare signals prior to and after the section where a fault is detected, a conversion circuit that converts such signals to a format, level, and the like that enables comparison therebetween is provided. Thus, the present invention can be applied even if the output signal is an analog signal unlike the playback signal, or even if the output signal is a digital signal of a differing signal format, level, or the like. In other words, the present invention enables provision of a semiconductor device and a sound output device that can handle various signal formats.

Here, with reference to FIGS. 10 to 12, a summary of specific configuration examples of sound output devices that differ in signal format will be described. Details of the configuration examples shown in FIGS. 10 to 12 will be described in later embodiments. The observation points [1] to [5] shown in FIGS. 10 to 12 correspond to observation points of semiconductor devices according to embodiments below.

Figure 10:
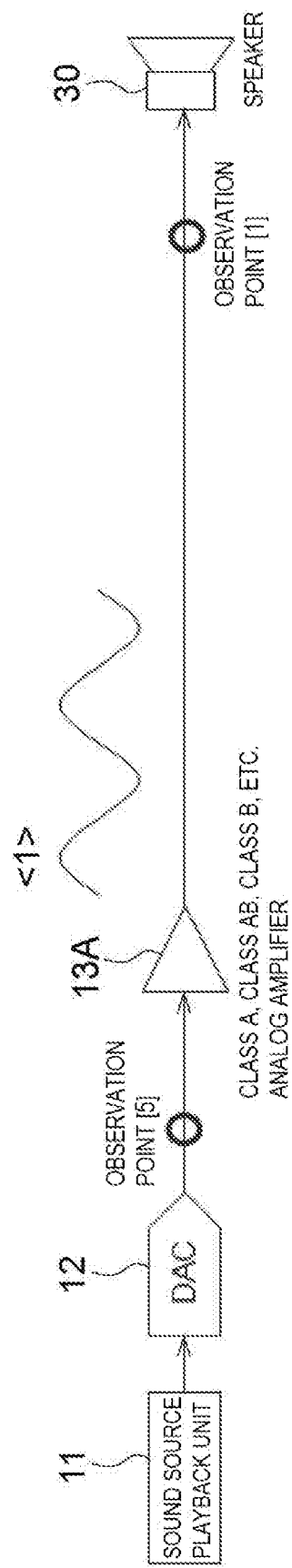
FIG. 10 depicts the position of an observation point of a semiconductor device according to an embodiment.

FIG. 10 shows a configuration in which, after the sound source playback unit 11, the DAC 12, the analog amplifier 13A, and the speaker 30 are connected in the stated order. A class A, class AB, class B analog amplifier, or the like is used as the analog amplifier 13A, for example. In this configuration, the speaker 30 is driven by the analog signal indicated with <1> in FIG. 10. The above sound output device 1A has this configuration.

Figure 11:
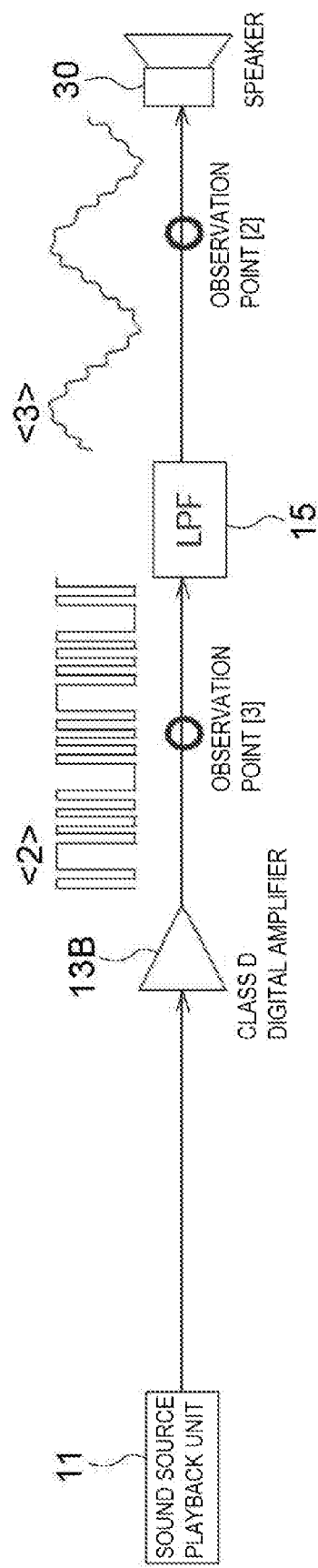
FIG. 11 depicts the position of an observation point of a semiconductor device according to another embodiment.

FIG. 11 shows a configuration in which, after the sound source playback unit 11, a digital amplifier 13B, an LPF 15, and the speaker 30 are connected in the stated order. That is, the playback signal is amplified as a digital signal without passing through a DAC. A class D digital amplifier is used as the digital amplifier 13B, for example. The LPF 15 is a filter that extracts a sound signal (audio signal) from the output of the digital amplifier 13B. In FIG. 11, <2> and <3> represent input/output waveforms of the LPF 15. If employing a configuration in which a DAC is provided inside the digital amplifier 13B and the signal is temporarily converted to an analog signal, then it is also possible to detect a fault in the DAC by extracting a signal to be compared to the output signal from the input position of the DAC.

Figure 12:
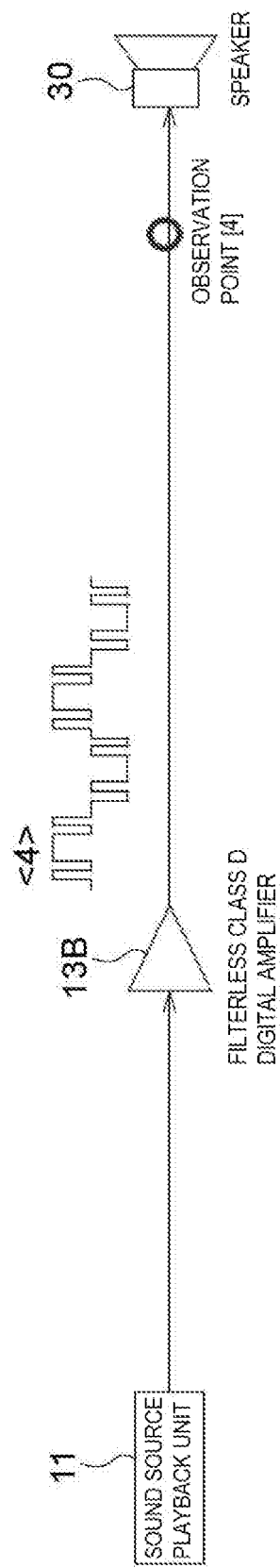
FIG. 12 depicts the position of an observation point of a semiconductor device according to another embodiment.

FIG. 12 shows a configuration in which, after the sound source playback unit 11, a filterless class D digital amplifier 13B and the speaker 30 are connected in the stated order. That is, the playback signal is transmitted to the speaker 30 after passing through only the digital amplifier 13B. In FIG. 12, <4> represents an output waveform of the digital amplifier 13B. If employing a configuration in which a DAC is provided inside the digital amplifier 13B and the signal is temporarily converted to an analog signal, then it is also possible to detect a fault in the DAC by extracting a signal to be compared to the output signal from the input position of the DAC.

Modification Examples

A semiconductor device and a sound output device according to the present modification example will be described with reference to FIGS. 2A to 2D. The present embodiment is a configuration in which a hysteresis is applied to the threshold of the conversion circuits (digital comparator 21A and comparator 22A in the above embodiment), and in which a plurality of thresholds are provided. In the description below, a configuration in which there are two thresholds Vt1 and Vt2 will be explained as an example. In FIGS. 2A to 2D, <1> represents the input waveform of the comparator, <2> represents the positional relationship between the input signal and the thresholds Vt1 and Vt2, and <3> represents the output waveform of the comparator.

Figure 2:
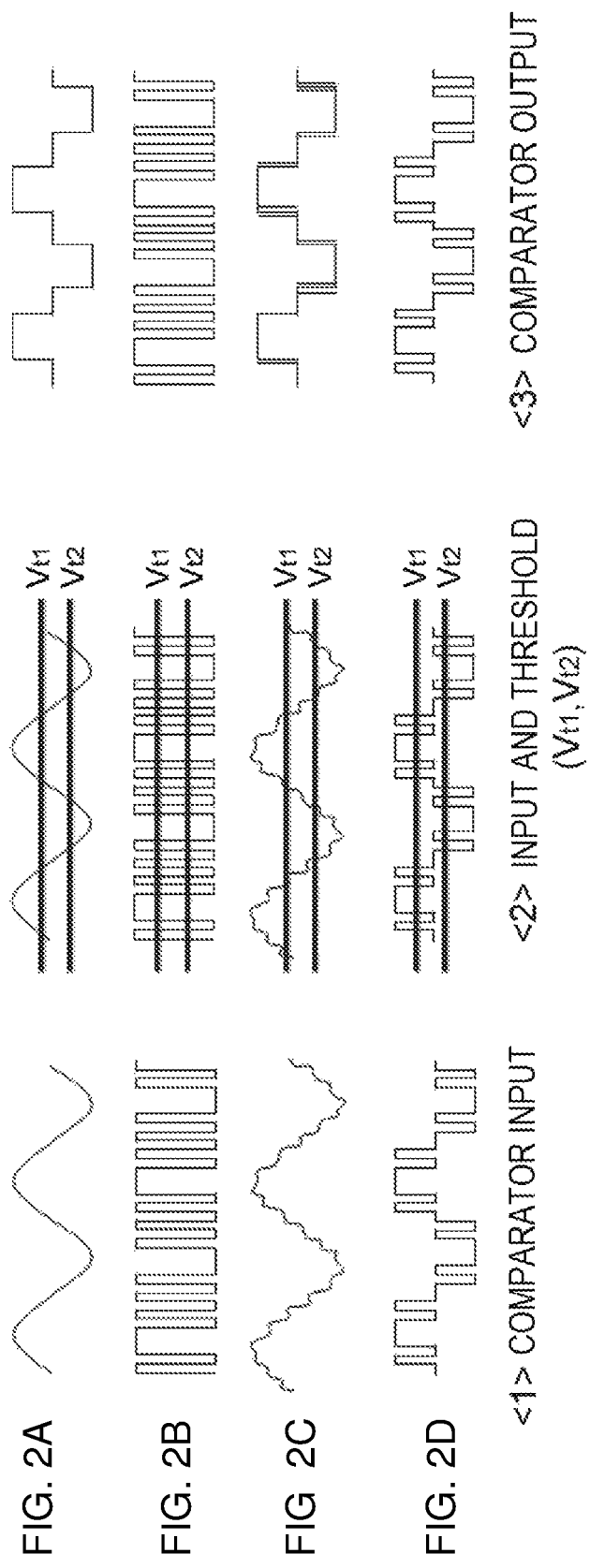
FIGS. 2A to 2D depict operations of a comparator when provided with a plurality of thresholds in a semiconductor device and a sound output device according to one embodiment.

The waveform indicating the comparator input in <1> of FIG. 2A is a waveform indicating the same analog signal as the waveform indicated in <1> of FIG. 10. The comparator here corresponds to the comparator 22A of FIG. 1. If the two thresholds Vt1 and Vt2 are set for the analog signal, the output from the comparator forms a ternary waveform as shown in <3>.

The waveform indicating the comparator input in <2> of FIG. 2B is a waveform indicating the same digital signal as the waveform indicated in <2> of FIG. 11. If the two thresholds Vt1 and Vt2 are set for the digital signal, the output forms a ternary waveform, but outwardly, the appearance of the output from the comparator is no different from the input signal as shown in <3>.

The waveform indicating the comparator input in <1> of FIG. 2C is a waveform indicating the same analog signal as the waveform indicated in <3> of FIG. 11. If the two thresholds Vt1 and Vt2 are set for the analog signal, the output from the comparator forms a ternary waveform as shown in <3>. The reason that the +1 pulse of the output waveform shown in <3> or the rising or falling of the pulse indicating −1 is divided into a plurality of sections is that there is ambiguity in terms of whether the sampling value is +1 or −1 at each level of the thresholds Vt1 and Vt2.

The waveform indicating the comparator input in <1> of FIG. 2D is a waveform indicating the same digital signal as the waveform indicated in <4> of FIG. 12. The comparator here corresponds to the digital comparator 21A of FIG. 1. If the two thresholds Vt1 and Vt2 are set for the digital signal, the output forms a ternary waveform, but outwardly, the appearance of the output from the comparator is no different from the input signal as shown in <3>.

Even if there were only one threshold here, by applying a hysteresis to the threshold of the comparator 22A and the digital comparator 21A of the above embodiment, for example, it is possible to reduce the effect of noise if a small amount of noise were to enter the input of the speaker 30 and there were no playback sound, for example. Additionally, as shown in FIGS. 2A to 2D, one possible configuration is to have two thresholds and apply a hysteresis to both thresholds. Also, a configuration may be adopted in which the plurality of thresholds can be adjusted from outside.

The plurality of thresholds are used in the following case, for example. In a waveform having an intermediate value in advance such as the output of the filterless class D amplifier (see <4> in FIG. 1), if the comparator or digital comparator stays at a high level or a low level (depending on the previous state) in a state where the intermediate value is outputted for a long time, a signal of a frequency component greatly differing from the actual signal frequency is sometimes outputted. Thus, by having a plurality of thresholds for the comparator and the digital comparator as in the present modification example and enabling identification of values such as the intermediate value (fixing the intermediate value), it is possible to mitigate a greatly differing frequency component.

Embodiment 2

Figure 3:
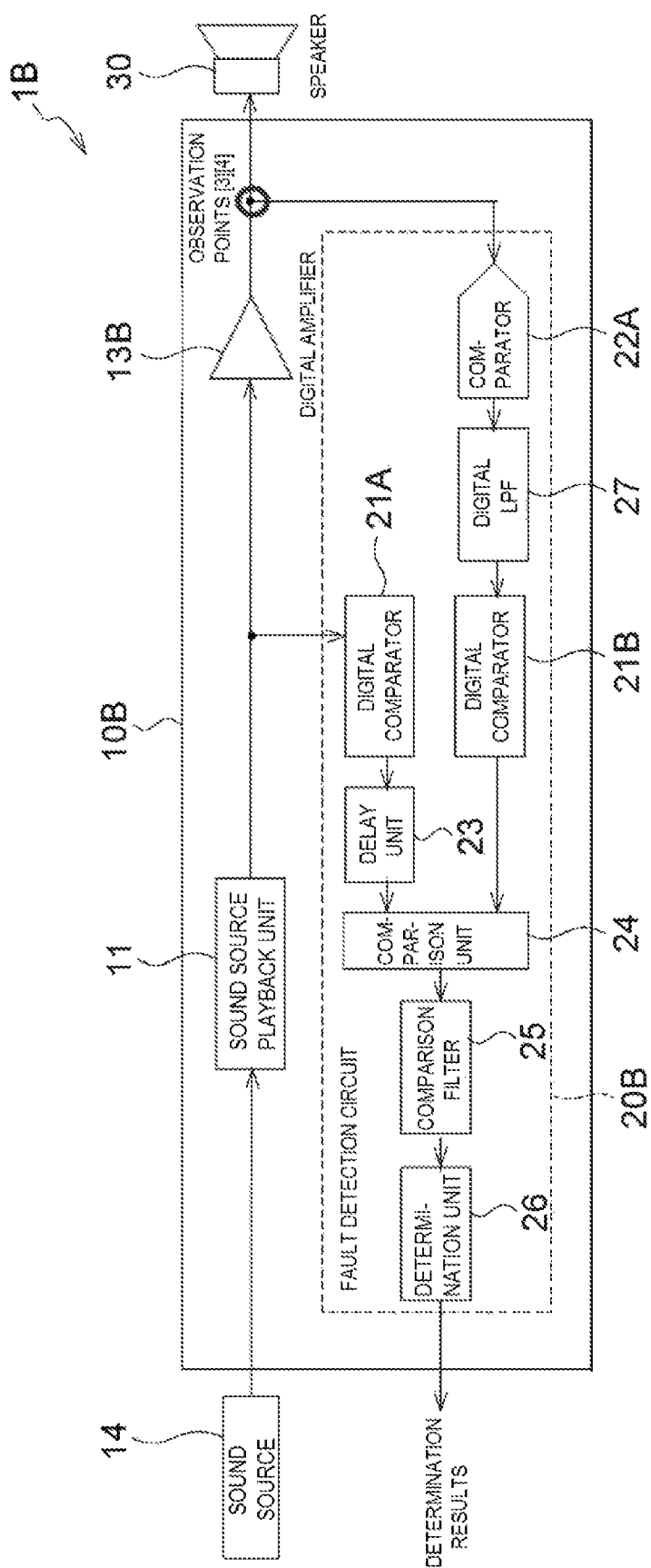
FIG. 3 is a block diagram showing an example of a semiconductor device and a sound output device according to another embodiment.

A semiconductor device 10B and a sound output device 1B according to the present embodiment will be described with reference to FIG. 3.

The present embodiment is one in which the semiconductor device 10A of the above embodiment is modified such that the analog amplifier 13A is replaced with a digital amplifier 13B, the fault detection circuit 20A is replaced with a fault detection circuit 20B, and the DAC 12 is omitted. Thus, components similar to those of the semiconductor device 10A are assigned the same reference characters and detailed descriptions thereof are omitted. In the sound output device 1B, of the sound emitted by the speaker 30, the digital signal immediately after having been played back in the sound source playback unit 11 from the sound source 14 is compared to the output signal from the digital amplifier 13B, and a fault that occurs between these two paths is detected.

Unlike the above embodiment, in the semiconductor device 10B of the present embodiment, first the output of the digital amplifier 13B is sampled by the comparator 22A, and then only the frequency component of sound played back by the speaker 30 is extracted by a digital LPF 27 and additionally subjected to waveform conversion by the digital comparator 21B. The playback signal from the digital comparator 21A is compared to the output signal from the digital comparator 21B in the comparison unit 24. The process in the comparison filter 25 and the determination unit 26 thereafter is similar to that of the above embodiment. By adopting this configuration of the semiconductor device 10B, the waveforms inputted to the digital comparators 21A and 21B are waveforms primarily having frequency components played back by the speaker 30, and thus, comparison can be performed by a similar configuration to the embodiment above. The comparator 22A and the digital comparators 21A and 21B used in this case may have the configuration of the above modification example, that is, a configuration in which a plurality of thresholds are provided.

Embodiment 3

A semiconductor device 10C and a sound output device 1C according to the present embodiment will be described with reference to FIG. 4.

The semiconductor device 10C includes a fault detection circuit 20C. The fault detection circuit 20C has a configuration in which the fault detection circuit 20A (FIG. 1) of the semiconductor device 10A of the above embodiment is additionally provided with a threshold control unit 28. Thus, components similar to those of the semiconductor device 10A are assigned the same reference characters and detailed descriptions thereof are omitted.

Figure 4:
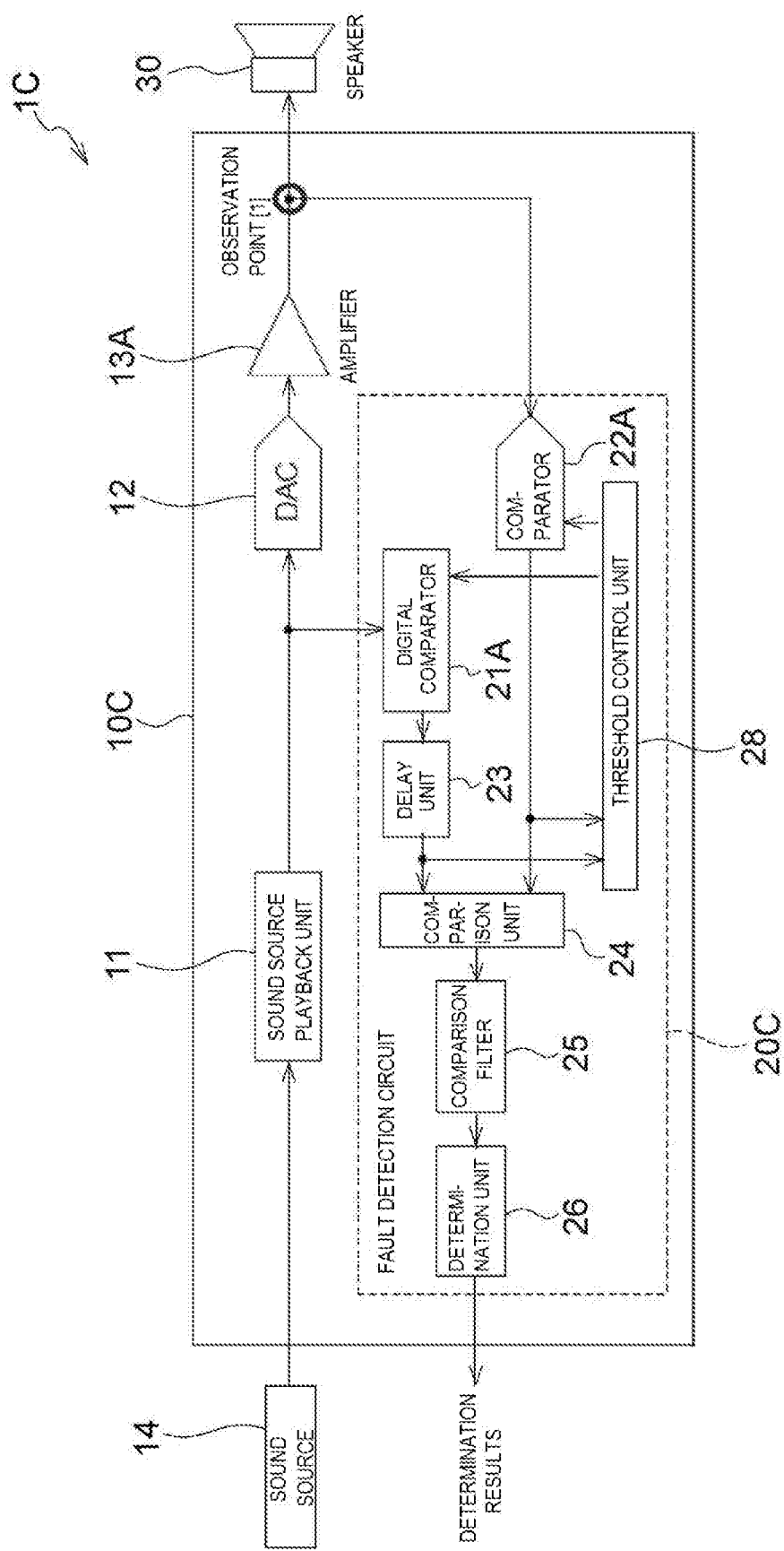
FIG. 4 is a block diagram showing an example of a semiconductor device and a sound output device according to another embodiment.

As shown in FIG. 4, the threshold control unit 28 receives the output signal from the delay unit 23 and executes a necessary process thereon, generates a signal to control the threshold of the digital comparator 21A, and controls the threshold of the digital comparator 21A using this control signal. Also, the threshold control unit 28 receives the output signal from the comparator 22A and executes a necessary process thereon, generates a signal to control the threshold of the comparator 22A, and controls the threshold of the comparator 22A using this control signal. Of course, the threshold control unit 28 need not control both the threshold of the digital comparator 21A and the threshold of the comparator 22A, and may control either one thereof.

In the present embodiment, the reason for controlling the threshold of the digital comparator 21A or the threshold of the comparator 22A is as follows. The waveform of the digital signal inputted to the digital comparator 21A is as shown in <1> of FIG. 2D, and the waveform inputted to the comparator 22A is as shown in <1> of FIG. 2A. Each of these input waveforms is converted to a binary signal with the thresholds set therefor as bounds, but if the positions of the thresholds (sometimes referred to below as "threshold setting values") in relation to the amplitude of the two input waveforms diverge by a prescribed value or greater, then even if the amplitude of the input waveform of the digital comparator 21A were the same as the amplitude of the input waveform of the comparator 22A, the outputs from the digital comparator 21A and the comparator 22A might greatly differ. The difference in threshold setting values occurs if the output level of the analog amplifier 13A is large, for example.

To deal with this situation, in the semiconductor device 10C, the threshold control unit 28 automatically controls the threshold of the digital comparator 21A or the threshold of the comparator 22A such that the threshold setting values thereof substantially match. More specifically, the output of the digital comparator 21A or the output of the comparator 22A is converted to amplitude information using the filter (LPF), the difference between the peak and the threshold is calculated, and by performing control based on this difference, the threshold is adjusted such that the threshold setting values are equivalent. In such a case, both of the threshold setting values may be adjusted independently, or one threshold setting value may be adjusted so as to match the other threshold setting value. If setting a plurality of thresholds such as in the above modification example, the filter can be omitted.

Embodiment 4

A semiconductor device 10D and a sound output device 1D according to the present embodiment will be described with reference to FIG. 5.

The semiconductor device 10D includes a fault detection circuit 20D. The fault detection circuit 20D has a configuration in which the fault detection circuit 20B (FIG. 3) of the semiconductor device 10B of the above embodiment is additionally provided with a threshold control unit 28. Thus, components similar to those of the semiconductor device 10B are assigned the same reference characters and detailed descriptions thereof are omitted.

Figure 5:
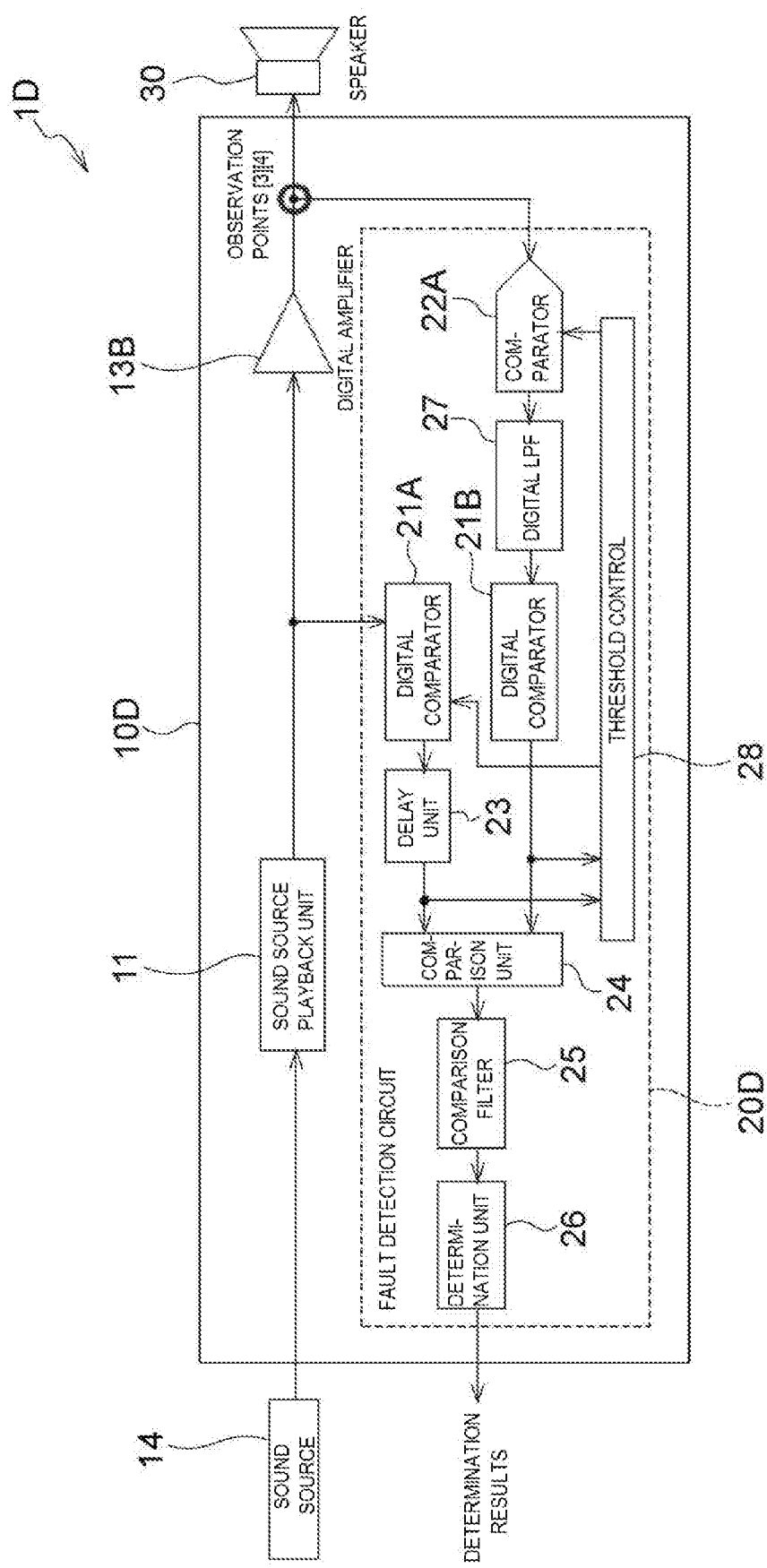
FIG. 5 is a block diagram showing an example of a semiconductor device and a sound output device according to another embodiment

As shown in FIG. 5, the threshold control unit 28 receives the output signal from the delay unit 23 and executes a necessary process thereon, generates a signal to control the threshold of the digital comparator 21A, and controls the threshold of the digital comparator 21A using this control signal. Also, the threshold control unit 28 receives the output signal from the digital comparator 21B and executes a necessary process thereon, generates a signal to control the threshold of the comparator 22A, and controls the threshold of the comparator 22A using this control signal. Of course, the threshold control unit 28 need not control both the threshold of the digital comparator 21A and the threshold of the comparator 22A, and may control either one thereof. As a method for changing the threshold of the digital comparator or the comparator, a method may be employed in which the threshold of the digital comparator or the comparator is set to be constant while the input signal of the digital comparator or the comparator is amplified or attenuated so as to adjust the amplitude thereof, thereby changing the threshold. This similar applies to cases mentioned below in which the threshold is changed in the digital comparator or the comparator.

In the semiconductor device 10D, the reason for and the principle by which at least one of the threshold of the digital comparator 21A and the threshold of the comparator 22A is controlled are similar to those of the semiconductor device 10C, and thus, detailed descriptions thereof are omitted here. In the semiconductor device 10D, the thresholds of the comparator 22A and the digital comparator 21A are automatically controlled using the outputs of the two digital comparators 21A and 21B such that the setting of the thresholds in relation to the input signal levels of the two digital comparators 21A and 21B, that is, the threshold setting values are equivalent. Similar to the semiconductor device 10C, in the semiconductor device 10D as well, the output of the digital comparator 21A or the output of the comparator 22A is converted to amplitude information using the filter (LPF), the difference between the peak and the threshold is calculated, and by performing control based on this difference the threshold is adjusted such that the threshold setting values are equivalent. If setting a plurality of thresholds such as in the above modification example, the filter can be omitted.

Embodiment 5

A semiconductor device 10E and a sound output device 1E according to the present embodiment will be described with reference to FIG. 6.

Figure 6:
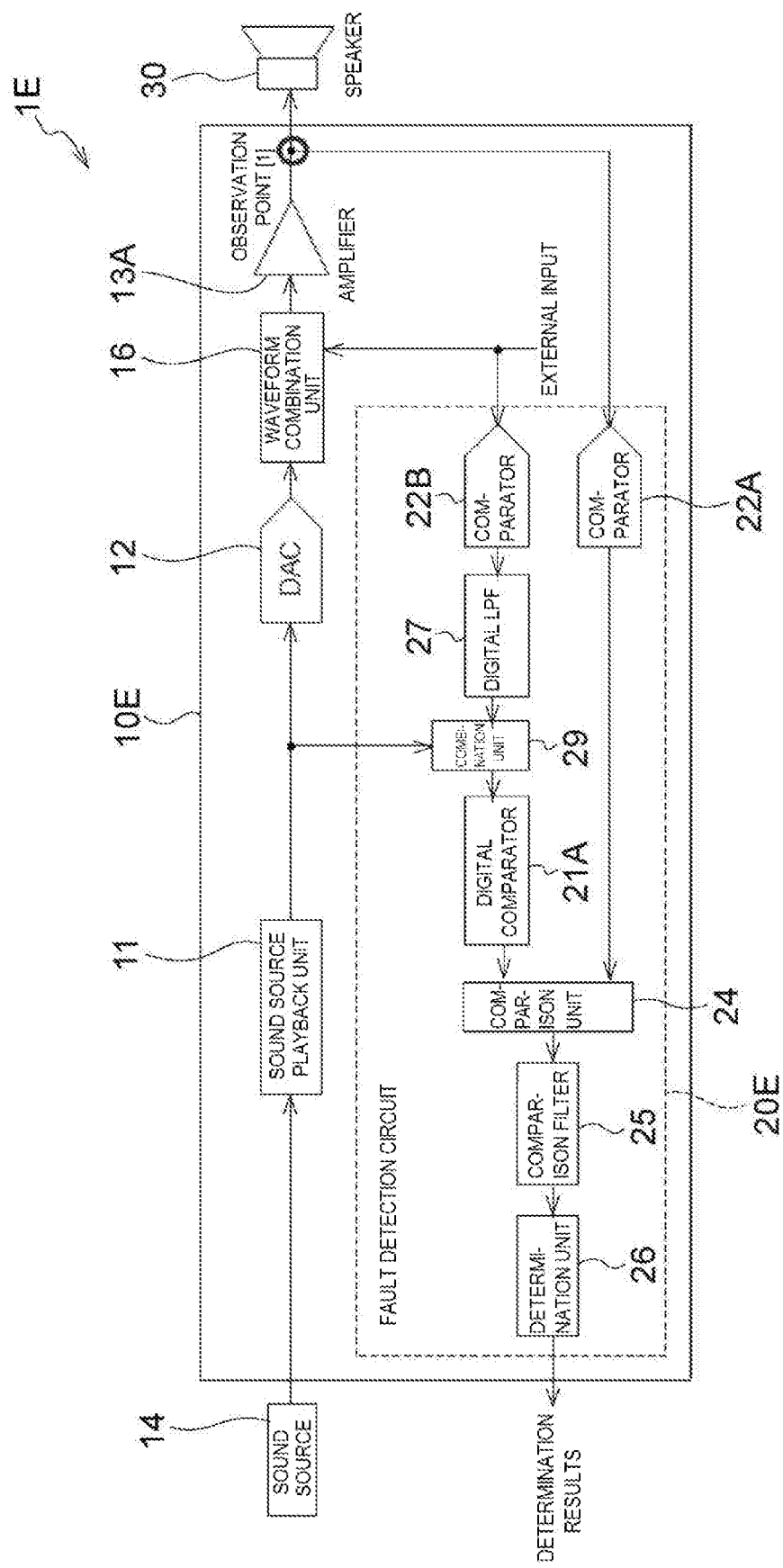
FIG. 6 is a block diagram showing an example of a semiconductor device and a sound output device according to another embodiment.

As shown in FIG. 6, the semiconductor device 10E has a configuration in which the fault detection circuit 20A of the semiconductor device 10A (FIG. 1) of the above embodiment is replaced with the fault detection circuit 20E, and a waveform combination unit 16 is added. The fault detection circuit 20E has, in addition to the configuration of the fault detection circuit 20A, a comparator 22B, a digital LPF 27, and a combination unit 29. Thus, components similar to those of the semiconductor device 10A are assigned the same reference characters and detailed descriptions thereof are omitted.

As shown in FIG. 6, an external input is inputted from the outside in the present embodiment. The "external input" of the present embodiment is an analog audio signal of music, for example, and is played back in a speaker simultaneously to the audio signal of the sound source 14. That is, the external input that is an analog signal is combined by the waveform combination unit 16 with the output signal of the DAC 12, which is also an analog signal. The combined analog signal (sometimes referred to below as "combined output signal") is amplified by the analog amplifier 13A and converted to sound by the speaker 30. The output of the analog amplifier 13A branched from the input to the speaker 30 is inputted to the comparator 22A in a manner similar to that of the semiconductor device 10A.

In order to handle the above configuration in which a sound signal from the external input is superimposed on the sound signal outputted from the analog amplifier 13A, the comparator 22B and the digital LPF 27 are added on the playback signal side. In other words, the other branched external input is converted to a binary signal by the comparator 22B and low frequency components thereof are extracted by the digital LPF 27. The external signal that passed through the comparator 22B and the digital LPF 27 is combined by the combination unit 29 with the playback signal from the sound source playback unit 11, and the combined sound signal is inputted to the digital comparator 21A. In this case, the combination unit 29 has the function of adjusting the level of the playback signal from the sound source playback unit 11 and the level of the external input so as to be at appropriate levels. Below, the signals combined by the combination unit 29 are sometimes referred to as the "combined playback signal".

The combined playback signal that has undergone waveform conversion by the digital comparator 21A and the combined output signal (signal attained by combining the playback signal and the external input) that has undergone waveform conversion by the comparator 22A are compared by the comparison unit 24, and the process after the comparison unit 24 is similar to that of the embodiments above, and thus, detailed descriptions thereof are omitted.

The present embodiment is one in which a configuration employing external input is applied to the semiconductor device 10A of Embodiment 1, but this configuration is not limited to being applied to the present embodiment and may be applied to the semiconductor devices 10B to 10D of Embodiments 2 to 4.

In the semiconductor device 10E, the delay unit 23 is omitted, but if the difference in delay, from the perspective of input to the comparison unit 24, between the path including the digital comparator 21A and the path including the comparator 22A is problematic, then a delay unit 23 may be provided on either or both of the paths. Also, if the difference in delay is problematic when performing combination at the waveform combination unit 16 or the combination unit 29, then a delay unit 23 may be provided at an appropriate position such as between the sound source playback unit 11 and the combination unit 29, between the digital LPF 27 and the combination unit 29, between the DAC 12 and the waveform combination unit 16, before or after the branching of the external input, or the like. In such a case, by adding a delay to the output of the digital comparator 21A or the output of the comparator 22B, the circuit size would be reduced due to the low bit width.

Embodiment 6

Figure 7:
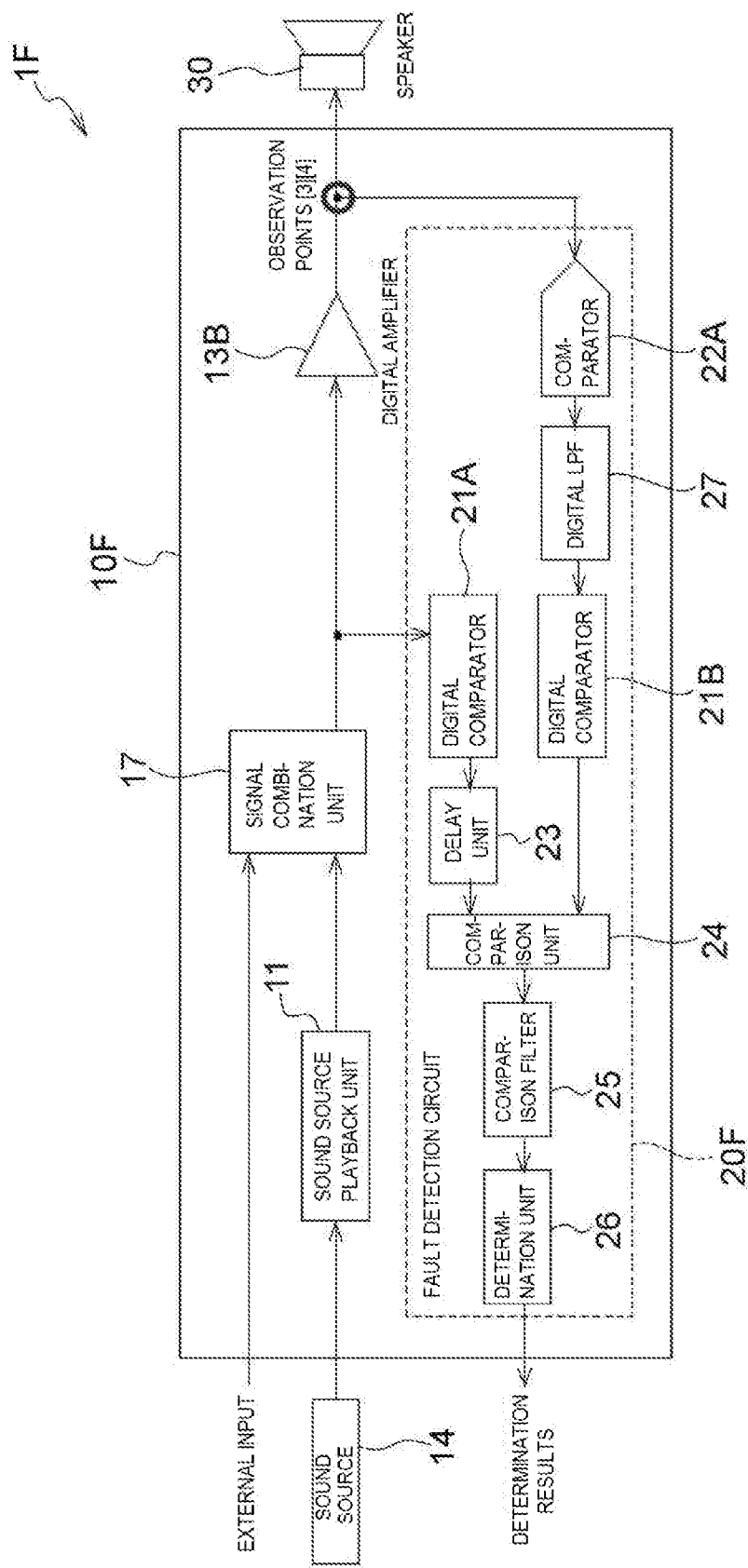
FIG. 7 is a block diagram showing an example of a semiconductor device and a sound output device according to another embodiment.

A semiconductor device 10F and a sound output device 1F according to the present embodiment will be described with reference to FIG. 7. The semiconductor device 10F has a configuration in which a signal combination unit 17 is added to the semiconductor device 10B (FIG. 3) according to Embodiment 2, and the fault detection circuit 20F is the same as the fault detection circuit 20B. Thus, components similar to those of the semiconductor device 10B are assigned the same reference characters and detailed descriptions thereof are omitted.

In Embodiment 5, the external input was an analog signal, but in the present embodiment, the external input is a digital signal. The external input according to the present embodiment has a signal format corresponding to the signal format of the output from the sound source playback unit 11 (that is, a decoded PCM signal), and thus, the signal combination unit 17, which performs combination with the external input, is disposed between the sound source playback unit 11 and the digital comparator 21A. In other words, the output from the signal combination unit 17 is a signal corresponding to the playback signal. The process thereafter is similar to that of the semiconductor device 10B, and thus, detailed descriptions thereof are omitted.

Embodiment 7

A semiconductor device 10G and a sound output device 1G according to the present embodiment will be described with reference to FIG. 8. In the present embodiment, fault detection of the DAC 12 is performed in greater detail.

Figure 8:
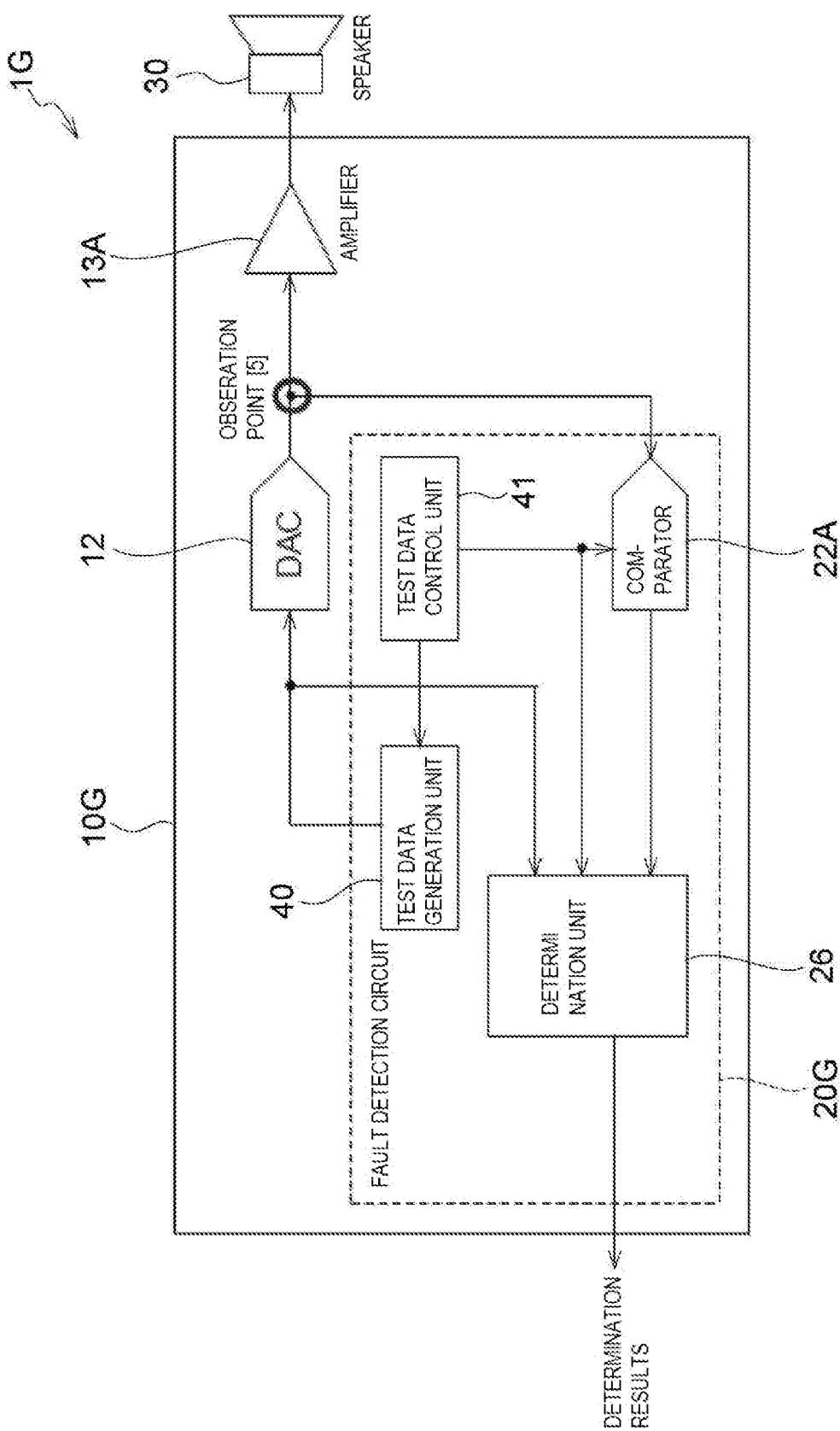
FIG. 8 is a block diagram showing an example of a semiconductor device and a sound output device according to another embodiment.

As shown in FIG. 8, the semiconductor device 10G includes the DAC 12, the analog amplifier 13A, and a fault detection circuit 20G. The fault detection circuit 20G includes a test data generation unit 40, a comparator 22A, a determination unit 26, and a test data control unit 41.

Recent sound signals are often high resolution with the number of steps of the amplitude being 16 bits or 24 bits. In such a case, the DAC 12 is also high resolution to correspond to the number of bits. In a method for detecting a fault by comparing the playback signal that is played by the sound source playback unit 11 to the output signal that is the input to the speaker 30, such as in the semiconductor devices and sound output devices of the above embodiments, it is sometimes not possible to determine a fault for lower bits of a high resolution DAC 12. The semiconductor device 10G is configured such that bit position corresponding to the resolution of the DAC 12 for which a fault is to be detected can be distinguished. In other words, the comparator 22A of the present embodiment includes a threshold setting function having a resolution that can identify the lower bits, and a fault in the DAC 12 is detected using this threshold setting function.

In FIG. 8, the test data generation unit 40 generates test data for detecting a fault in the DAC 12. The test data generation unit 40 can generate test data in which the value of the bit in which the fault of the test data is to be detected is changed. The comparator 22A converts the output signal from the DAC 12 into a binary signal. The determination unit 26 compares the test data to the output signal from the comparator 22A to perform determination. The determination results are transmitted to the test data control unit 41 or an MCU (not shown). The test data control unit 41 that has received the determination results changes the test data, that is, changes the value of the target bit, and performs the following fault detection process. Alternatively, the MCU that has received the determination results executes a necessary process such as notification. The test data control unit 41 controls the test data generation unit 40, the comparator 22A, and the determination unit 26.

Next, the operation of the semiconductor device 10G will be described. First, the test data control unit 41 controls the test data generation unit 40 such that test data that has set thereto the value of the bit for which fault detection is to be performed (hereinafter, "detection bit") is outputted.

Next, the comparator 22A is controlled such that a threshold is moved (scanned) in relation to the output signal after the test data set by the test data generation unit 40 passes through the DAC 12. Then, the threshold of the comparator 22A for when the output of the comparator 22A has changed is maintained. The determination as to whether the output from the comparator 22A has changed is performed by controlling the determination unit 26 so as to perform comparative determination of the test data from the test data generation unit 40 and the output signal from the comparator 22A. The test data control unit 41 additionally controls the test data generation unit 40 such that test data with changed detection bits is generated, and similarly maintains the threshold of the comparator 22A for when the output of the comparator 22A is changed. By repeating the above, the presence or absence of a fault in the DAC 12 is determined at the bit level according to whether or not the relationship between the input of the DAC 12 and the threshold 22A is as intended. The present embodiment describes as an example a configuration using the analog amplifier 13A, but the fault detection method according to the present embodiment can be applied to the DAC even if the analog amplifier 13A were replaced with a digital amplifier, as long as the digital amplifier has the DAC.

Embodiment 8

Figure 9:
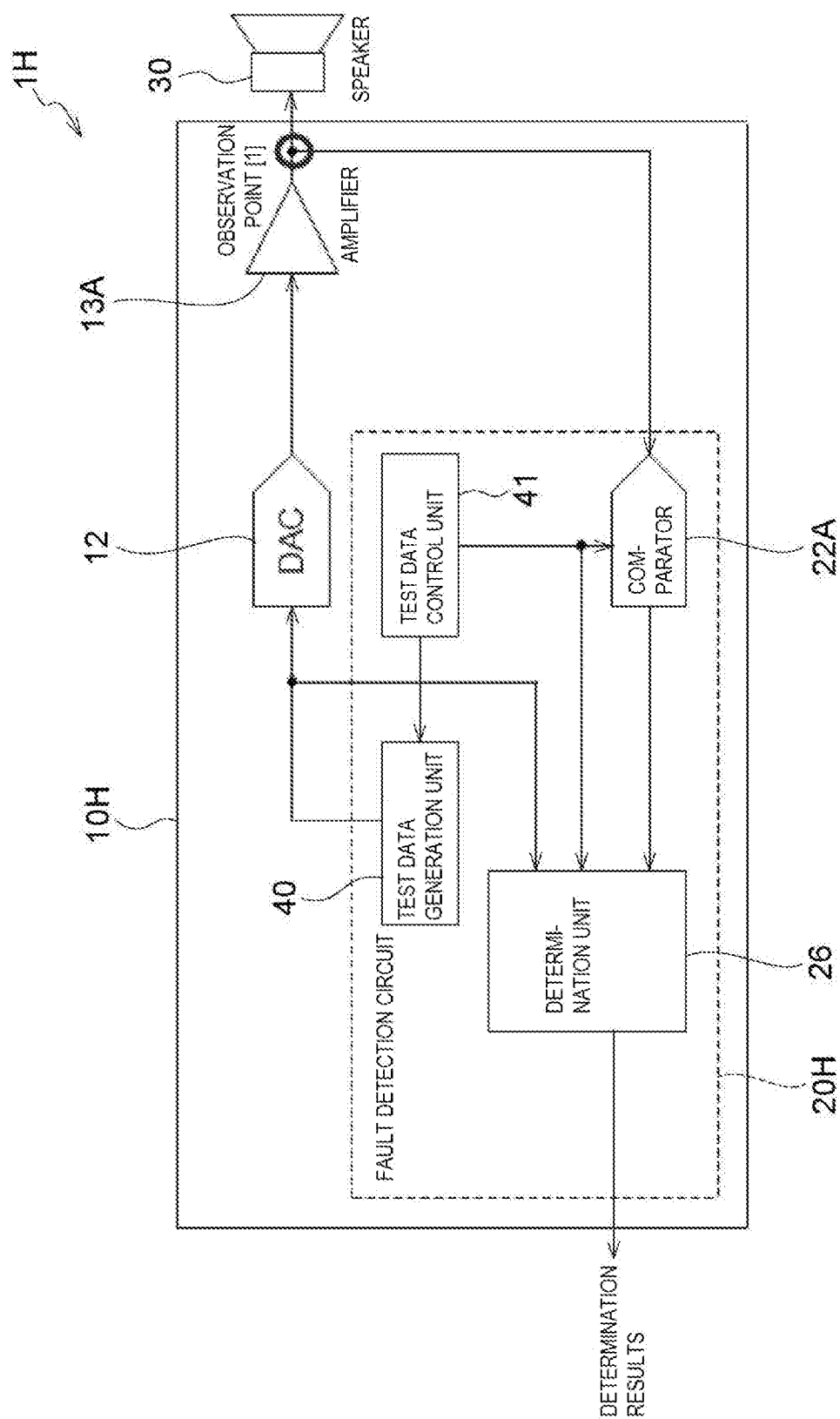
FIG. 9 is a block diagram showing an example of a semiconductor device and a sound output device according to another embodiment.

A semiconductor device 10H and a sound output device 1H according to the present embodiment will be described with reference to FIG. 9. The object of the semiconductor device 10H is also to detect faults in the DAC 12 at the bit level, but in the semiconductor device 10H, the observation point [5] of the semiconductor device 10G of the above embodiment is changed to the observation point [1], or in other words, to the output position of the analog amplifier 13A. A fault detection circuit 20H is the same as the fault detection circuit 20G. Thus, components similar to those of the semiconductor device 10G are assigned the same reference characters and detailed descriptions thereof are omitted.

Here, in the output after the signal has passed through the analog amplifier 13A, DC (direct current) components sometimes do not pass through depending on the configuration. In such a case, in consideration of the frequency characteristics of the path, the test data control unit 41 controls the test data generation unit 40 so as to generate test data at a frequency that can pass through, and then controls the determination unit 26 so as to perform determination using the test data.

In Embodiments 7 and 8, a configuration was described as an example in which the semiconductor devices 10G and 10H were made independent, as a configuration for performing detailed fault detection of the DAC 12, but the embodiments are not limited to this configuration. For example, the semiconductor device 10G of Embodiment 7 or the semiconductor device 10H of Embodiment 8 may be incorporated into the semiconductor device 10A of Embodiment 1 such that both normal fault detection and detailed fault detection of the DAC 12 can be performed. In such a case, the input signal to the DAC 12 may be configured such that a switch can be used to switch between the playback signal and the test data, for example.

DESCRIPTION OF REFERENCE CHARACTERS 1 sound output device
10A, 10B, 10C, 10D, 10E, 10F, 10G, 10H semiconductor device (sound playback device)
11 sound source playback unit
12 DAC
13A analog amplifier
13B digital amplifier
14 sound source
15 LPF
16 waveform combination unit
17 signal combination unit
20A, 20B, 20C, 20D, 20E, 20F, 20G, 20H fault detection circuit
21A, 21B digital comparator
22A, 22B comparator
23 delay unit
24 comparison unit
25 comparison filter
26 determination unit
27 digital LPF
28 threshold control unit
29 combination unit
30 speaker
40 test data generation unit
41 test data control unit

What is claimed is:

1. A semiconductor device, comprising:
a sound source playback unit that plays back sound data from a sound source and outputs a playback signal;
an amplification unit that amplifies the playback signal and outputs the playback signal as an output signal converted to sound in a speaker;
a fault detection unit including a first conversion circuit that compares the playback signal to a predetermined first threshold, converts a waveform of the playback signal, and outputs the converted waveform as a converted playback signal, a second conversion circuit that compares the output signal to a predetermined second threshold, converts a waveform of the output signal, and outputs the converted waveform as a converted output signal, a comparison circuit that compares the converted playback signal to the converted output signal, and a determination circuit that determines an output of the comparison circuit to detect a fault in the amplification unit; and
a low-pass filter between the comparison circuit and the determination circuit,
wherein the first conversion circuit is a comparator that converts the playback signal into a first binary signal to generate the converted playback signal,
wherein the second conversion circuit is a comparator that converts the output signal into a second binary signal to generate the converted output signal,
wherein the comparison circuit outputs a first logical value if the converted playback signal and the converted output signal match and a second logical value if the converted playback signal and the converted output signal differ from each other,
wherein the low-pass filter outputs a value between the first logical value and the second logical value, and
wherein the determination circuit has a threshold value between the first logical value and the second logical value, and compares the output from the low-pass filter to the threshold to determine the output of the comparison circuit.

2. The semiconductor device according to claim 1,
wherein the sound data is a digital signal, and
wherein the amplification unit includes a digital/analog conversion circuit that converts the playback signal that is a digital signal to an analog signal.

3. The semiconductor device according to claim 1,
wherein the first conversion circuit has N said first thresholds that differ from each other (N being an integer of 3 or greater) and converts the playback signal into a first (N+1)-ary signal, and
wherein the second conversion circuit has N said second thresholds that differ from each other and converts the output signal into a second (N+1)-ary signal.

4. The semiconductor device according to claim 1, further comprising:
a threshold control unit that controls a value of the first threshold in relation to an amplitude of the playback signal, and controls a value of the second threshold in relation to an amplitude of the output signal,
wherein the threshold control unit controls the first threshold and the second threshold such that the value of the first threshold is the same as the value of the second threshold.

5. The semiconductor device according to claim 1, further comprising:
a first combination unit that combines an external signal inputted from outside the semiconductor device with the playback signal to generate a combined playback signal; and a second combination unit that combines the external signal with the output signal to generate a combined output signal, wherein the first conversion circuit converts the combined playback signal to output the converted playback signal, and wherein the second conversion circuit converts the combined output signal to output the converted output signal.

6. The semiconductor device according to claim 1, wherein the sound data is a digital signal with a predetermined bit count, wherein the amplification unit includes a digital/analog conversion circuit that converts the playback signal that is a digital signal to an analog signal, and wherein the semiconductor device further comprises: a bit fault detection unit that designates a bit position of the bit count of the digital/analog conversion circuit and detects a fault in the digital/analog conversion circuit.

7. The semiconductor device according to claim 6, wherein the bit fault detection unit includes a generation unit that generates test data for detecting a fault in the digital/analog conversion circuit by designating the bit position and inputs the test data into the digital/analog conversion circuit, a second comparison circuit that compares the output of the digital/analog conversion circuit to a third threshold, and a control unit that controls the generation unit and the second comparison circuit, and wherein the control unit changes the third thresholds for each of a plurality of pieces of the test data that are inputted to the second comparison circuit and have differing said bit positions and compares the third thresholds, compares the value of the third threshold with inverted comparison results to an expected value to which the third threshold acquired in advance is to invert, and detects a fault in each of the bit positions.

8. The semiconductor device according to claim 1, further comprising: the sound source that transmits a signal to be played back by the sound source playback unit.

9. A sound output device, comprising:

the semiconductor device according to claim 1;

the sound source that transmits a signal to be played back by the sound source playback unit; and the speaker that amplifies the playback signal and converts the playback signal to sound.

\* \* \* \* \*